US009961769B2

(12) United States Patent
Hossain et al.

(10) Patent No.: US 9,961,769 B2
(45) Date of Patent: *May 1, 2018

(54) MICROELECTRONIC SUBSTRATE FOR ALTERNATE PACKAGE FUNCTIONALITY

(71) Applicant: Intel Corporation, Santa Clara, CA (US)

(72) Inventors: Md Altaf Hossain, Portland, OR (US); Cliff C. Lee, Portland, OR (US); David W. Browning, Beaverton, OR (US); Itai M. Pines, Beaverton, OR (US); Brian P. Kelly, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 57 days.

This patent is subject to a terminal disclaimer.

(21) Appl. No.: 14/162,002

(22) Filed: Jan. 23, 2014

(65) Prior Publication Data

US 2014/0133075 A1 May 15, 2014

Related U.S. Application Data

(63) Continuation of application No. 13/153,608, filed on Jun. 6, 2011, now Pat. No. 8,674,235.

(51) Int. Cl.
*H05K 1/11* (2006.01)
*H01L 23/498* (2006.01)
(Continued)

(52) U.S. Cl.
CPC ........ *H05K 1/111* (2013.01); *H01L 23/49838* (2013.01); *H05K 1/112* (2013.01);
(Continued)

(58) Field of Classification Search
CPC .................................................... H05K 1/111
(Continued)

(56) References Cited

U.S. PATENT DOCUMENTS

| 5,631,807 A | 5/1997 | Griffin |
| 6,612,850 B2 | 9/2003 | Dai |

(Continued)

FOREIGN PATENT DOCUMENTS

| CN | 1906986 A | 1/2007 |
| CN | 101663926 | 3/2010 |

(Continued)

OTHER PUBLICATIONS

Office Action received for Korean Patent Application No. 10-2013-7033510, dated Mar. 12, 2015, 4 pages of English Translation and 5 pages of Korean Office Action.

(Continued)

*Primary Examiner* — Chau N Nguyen
(74) *Attorney, Agent, or Firm* — Hanley, Flight & Zimmerman, LLC

(57) ABSTRACT

The present disclosure relates to microelectronic substrates, such as interposers, motherboards, test platforms, and the like, that are fabricated to have overlapping connection zones, such that different microelectronic devices, such as microprocessors, chipsets, graphics processing devices, wireless devices, memory devices, application specific integrated circuits, and the like, may be alternately attached to the microelectronic substrates to form functional microelectronic packages.

7 Claims, 6 Drawing Sheets

(51) Int. Cl.
*H01L 23/00* (2006.01)
*H05K 3/34* (2006.01)

(52) U.S. Cl.
CPC ........ *H01L 24/16* (2013.01); *H01L 2224/131* (2013.01); *H01L 2224/16225* (2013.01); *H01L 2224/16227* (2013.01); *H01L 2224/16237* (2013.01); *H01L 2924/12042* (2013.01); *H05K 3/3436* (2013.01); *H05K 2201/09972* (2013.01); *H05K 2201/10378* (2013.01)

(58) Field of Classification Search
USPC ........................................................ 174/261
See application file for complete search history.

(56) References Cited

U.S. PATENT DOCUMENTS

| | | | |
|---|---|---|---|
| 6,777,804 | B1 | 8/2004 | Hsu |
| 7,071,028 | B2 * | 7/2006 | Koike ...................... H01B 1/22 257/E21.502 |
| 7,888,174 | B2 * | 2/2011 | Cheng ................. H01L 23/5389 257/E21.503 |
| 8,674,235 | B2 * | 3/2014 | Hossain et al. ............... 174/261 |
| 2002/0016089 | A1 | 2/2002 | Dai |
| 2002/0020898 | A1 | 2/2002 | Vu et al. |
| 2002/0079591 | A1 | 6/2002 | Sakiyama et al. |
| 2006/0271914 | A1 | 11/2006 | Gopal et al. |
| 2007/0158101 | A1 | 7/2007 | Chikagawa et al. |
| 2008/0149381 | A1 | 6/2008 | Kawagishi et al. |
| 2008/0169573 | A1 | 7/2008 | Hsieh |
| 2008/0271914 | A1 | 11/2008 | Tanaka et al. |
| 2009/0183894 | A1 | 7/2009 | Loyens et al. |
| 2009/0250803 | A1 | 10/2009 | Arai |
| 2010/0027225 | A1 * | 2/2010 | Yuda et al. ................... 361/736 |

FOREIGN PATENT DOCUMENTS

| | | |
|---|---|---|
| JP | 61-084905 A | 4/1986 |
| JP | 62-196376 U | 12/1987 |
| JP | 09-298217 A | 11/1997 |
| JP | H09298217 | 11/1997 |
| JP | 10-135223 A | 5/1998 |
| JP | 10-150120 A | 6/1998 |
| JP | 10-294553 A | 11/1998 |
| JP | 11-345908 A | 12/1999 |
| JP | 2001-033515 A | 2/2001 |
| JP | 2002190568 | 7/2002 |
| JP | 2003-188508 A | 7/2003 |
| JP | 2005-101082 A | 4/2005 |
| JP | 2009-231489 A | 10/2009 |
| JP | 2009-252859 A | 10/2009 |
| JP | 2009-260255 A | 11/2009 |
| KR | 10-0648040 B1 | 11/2006 |
| KR | 10-2009-0105661 A | 10/2009 |
| WO | 2012/170328 A2 | 12/2012 |
| WO | 2012/170328 A3 | 4/2013 |

OTHER PUBLICATIONS

Office Action and Search Report received for Taiwanese Patent Application No. 101118791, dated Jul. 24, 2014, 20 pages of Office Action and Search report including 10 pages of English Translation.
International Search Report and Written Opinion received for PCT Patent Application No. PCT /US2012/040677, dated Feb. 26, 2013, 12 pages.
International Preliminary Report on Patentability and Written Opinion received for PCT Patent Application No. PCT/US2012/040677, dated Dec. 27, 2013, 9 pages.
Notice of Allowance received for U.S. Appl. No. 13/153,608, dated Oct. 30, 2013, 10 pages.
Office Action and Search Report received for Taiwanese Patent Application No. 101118791, dated Nov. 28, 2014, 6 pages of Office Action and Search report including 7 pages of English Translation.
Office Action received for United Kingdom Patent Application No. 1321487.9, dated Oct. 31, 2014, 7 pages.
Office Action received for Japanese Patent Application No. 2014-513781, dated Nov. 18, 2014, 3 pages of English Translation and 3 pages of Japanese Office Action.
Office Action received for United Kingdom Patent Application No. 1321487.9, dated May 28, 2015, 2 pages.
Office Action received for Japanese Patent Application No. 2014-513781, dated Jul. 14, 2015, 3 pages of English Translation and 3 pages of Japanese Office Action.
Office Action received for Chinese Patent Application No. 201280027841.0, dated Oct. 26, 2015, 12 pages of Chinese Office Action Only.
Notice of Allowance and Search Report received for Taiwanese Patent Application No. 101118791, dated Apr. 7, 2016, 2 Pages.
Notice of Allowance received for Korean Patent application No. 10-2013-7033510, dated Jun. 26, 2015. 5 Pages.
Office Action received for Germany Patent Application No. 11 2012 002 370.6, dated Jul. 15, 2016, 11 pages of German Office Action.
Notice of Allowance received for Chinese Patent Application No. 201280027841.0, dated Apr. 19, 2016, 4 Pages of Chinese Office Action including 2 Pages of English Translation.
Notice of Allowance received for Japanese Patent Application No. 2014-513781, dated May 10, 2016, 3 Pages.
Japanese Patent Office, "Notice of Reason(s) for Rejection," issued in connection with Japanese Patent Application No. 2016-099170, dated Feb. 28, 2017, 4 pages.
Japanese Patent Office, "Decision to Grant a Patent," issued in connection with Japanese Patent Application No. 2016-099170, dated Jun. 6, 2017, 4 pages.
German Patent Office, "Office Action," issued in connection with German Patent Application No. 11 2012 002 370.6, dated Sep. 7, 2017, 13 pages.
State Intellectual Property Office of China, "Notification of the First Office Action", issued in connection with Chinese Patent Application No. 201610364334.6, dated Feb. 24, 2018, 10 pages.

* cited by examiner

MICROELECTRONIC SUBSTRATE FOR ALTERNATE PACKAGE FUNCTIONALITY

RELATED APPLICATION

The present application is a continuation of U.S. patent application Ser. No. 13/153,608, filed Jun. 6, 2011, and entitled "MICROELECTRONIC SUBSTRATE FOR ALTERNATE PACKAGE FUNCTIONALITY" which is hereby incorporated herein by reference in its entirety and for all purposes.

BACKGROUND OF THE INVENTION

The present disclosure relates generally to the field of microelectronic device packaging, and, in particular, to the fabrication of microelectronic substrates used to interconnect microelectronic devices to form functional microelectronic packages.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
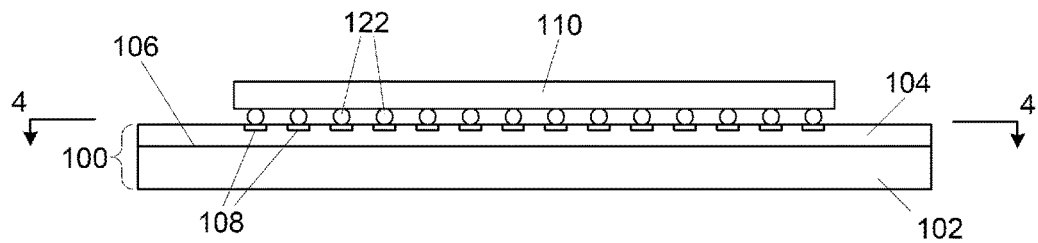
FIG. 1 illustrates a side cross-sectional depiction of a substrate, according to one embodiment of the present description, having a first microelectronic device attached thereto.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In various embodiments of the present description, microelectronic substrates are fabricated to have overlapping connection zones, such that different microelectronic devices may be alternately attached to the microelectronic substrates to form functional microelectronic packages.

In the production of microelectronic packages, one or more microelectronic devices are typically mounted on a microelectronic substrate for packaging purposes. The microelectronic substrate may be any substrate appropriate to a desired purpose, including but not limited to an interposer, a motherboards, a test platform, and the like, as will be understood to those skilled in the art. The microelectronic devices may include, but are not limited to, microprocessors, chipsets, graphics processing devices, wireless devices, memory devices, application specific integrated circuits, and the like.

The microelectronic substrate may comprises a core having at least one trace network formed on one surface thereof. The trace network may include multiple layers of dielectric material, conductive traces, and vias through the dielectric material layers to which microelectronic dice, microelectronic devices, and/or microelectronic components may be electrically connected. The trace network may enable interconnection between microelectronic dice, microelectronic devices, and/or microelectronic components mounted thereon, and may also connect to external interconnects, such as solder balls or pins for electrical communication with external components. The external interconnects maybe formed on the microelectronic substrate first surface or on an opposing second surface of the microelectronic substrate.

Figure 2:
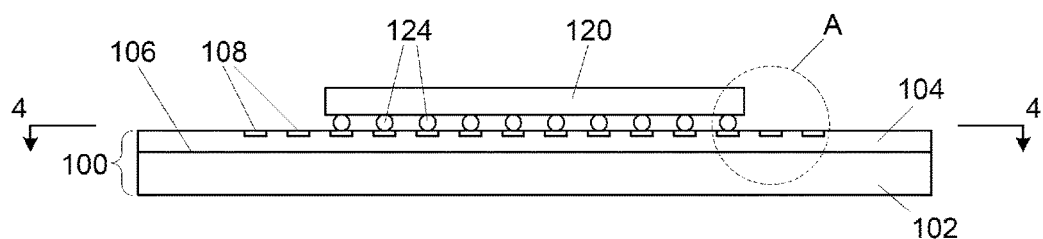
FIG. 2 illustrates a side cross-sectional depiction of a substrate, according to one embodiment of the present description, having a second microelectronic device attached thereto.
Figure 3:
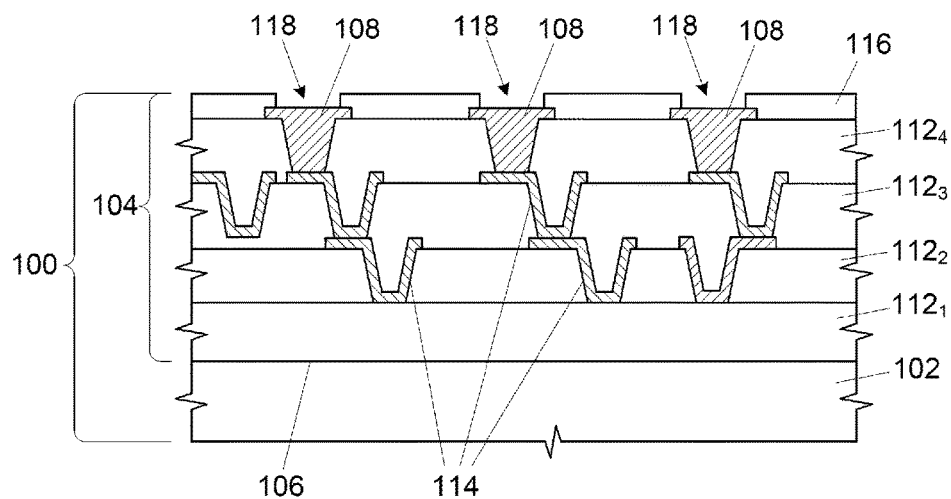
FIG. 3 illustrates side cross-sectional depiction of inset A for FIG. 2 illustrating an embodiment of the substrate of the present description.

FIGS. 1-3 illustrates side cross sectional views of a microelectronic substrate 100, according to one embodiment of the present description. As shown in FIGS. 1-3, the microelectronic substrate 100 may comprise a core 102 having a first trace network 104 formed on a first surface 106 of the substrate core 102. The substrate core 102 may be any appropriate material, including, but not limited to, bismaleimine triazine resin, fire retardant grade 4 material, polyimide materials, glass reinforced epoxy matrix material, and the like, as well as laminates or multiple layers thereof.

A first microelectronic device 110 (see FIG. 1) or a second microelectronic device 120 (see FIG. 2), such as a microprocessor, a chipset, a memory device, an ASIC, and the like, may be attached to the first trace network 104 through a plurality of interconnects 122 (see FIG. 1) extending from bond pads (not shown) on the first microelectronic device 110 or through a plurality of interconnects 124 (see FIG. 2) extending from bond pads (not shown) on the second microelectronic device 120 to their respective contact lands 108 in or on the first trace network 104 to make electrical contact therebetween, as will be understood by those skilled in the art. An underfill material (not shown) may be dispersed between the first microelectronic device 110 (see FIG. 1) or the second microelectronic device 120 (see FIG. 2) and the microelectronic substrate 100 to provide mechanical support, contamination protection, and improves package reliability.

FIG. 3 (insert A of FIG. 1) illustrates an embodiment of the first trace network 104 comprising at least one dielectric layer (illustrates as elements $112_1$-$112_4$) formed on the substrate core first surface 106 with a plurality of conductive traces 114 formed on and through the various dielectric layers $112_1$-$112_4$. Although four dielectric layers $112_1$-$112_4$ are illustrated, any appropriate number of layers could be formed. The dielectric layers $112_1$-$112_4$ may be any appropriate dielectric material, including but not limited to, silicon dioxide ($SiO_2$), silicon oxynitride ($SiO_xN_y$), silicon nitride ($Si_3N_4$), silica filled epoxy materials, and the like, which may be formed by any known technique known in the art, including but not limited to, chemical vapor deposition ("CVD"), physical vapor deposition ("PVD"), atomic layer deposition ("ALD"), and the like. The conductive traces 114 may be any appropriate conductive material, including, but not limited to metals, such as copper, gold, silver, aluminum, alloys thereof and the like, and may be formed by any techniques known in the art, including forming vias through the individual dielectric layer $112_1$-$112_4$ (such as by laser ablation, ion ablation, and lithographic etching), depositing a conductive material layer, and patterning the conductive material layer by any known technique in art including lithography, wherein a photoresist material is patterned on the conductive material layer and portions thereof are etched away using the photoresist material as a shield to an etchant.

As further shown in FIG. 3, the plurality of contact lands 108 may be formed on or in an outermost dielectric layer (illustrated as element $112_4$), such as by deposition and lithograph patterning techniques. The contact lands 108 may formed to extend through the outermost dielectric layer (illustrated as element $112_4$) to each contact at least one conductive trace 114. A solder resist layer 116 may be patterned over the outermost dielectric layer (illustrated as element $112_4$) with a plurality of openings 118 therethrough to expose a portion of each of the contact lands 108. The solder resist layer 116 may be any appropriate material, such as a polymer material, and may be used to ensure that each of the plurality of first microelectronic device interconnects 122 of FIG. 1 or second microelectronic device interconnects 124 of FIG. 2 remain in a desired area, as will be understood to those skilled in the art.

Figure 4:
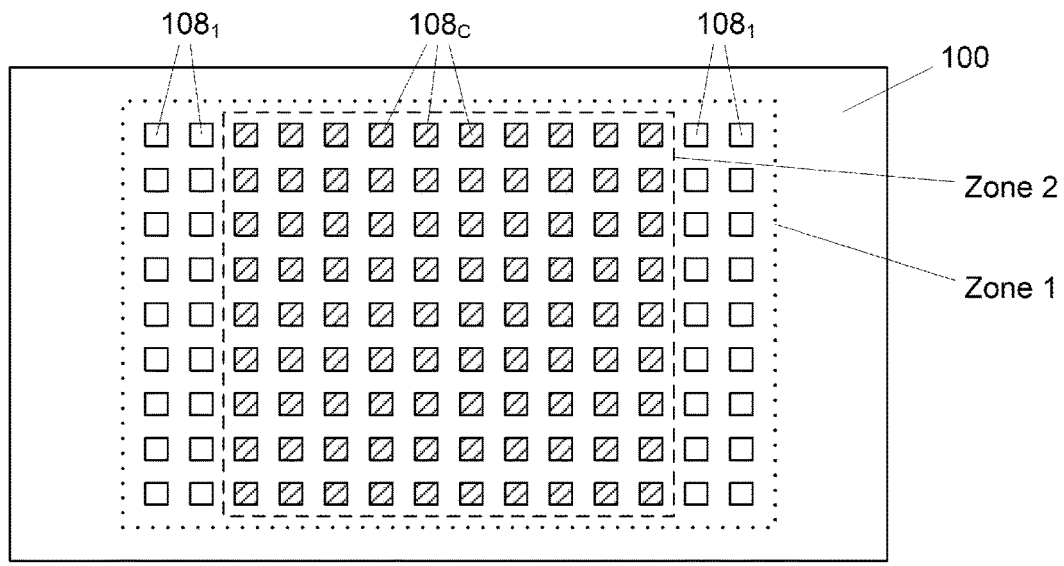
FIG. 4 illustrates a top plane view along line 4-4 of FIG. 1 or FIG. 2 illustrating one embodiment of a substrate according to the present description.

FIG. 4 illustrates a top plan view of the microelectronic substrate 100, according to one embodiment of present description, illustrating a configuration of contact lands which is adapted to accommodate microelectronic devices of differing functionality to form functional microelectronic packages. As shown in FIG. 4, the microelectronic substrate 100 may include a plurality of contact lands, shown as elements $108_1$ and $108_c$. The contact lands 108c, which are shaded for clarity, are common connections with regard to the first microelectronic device 110 (see FIG. 1) and the second microelectronic device 120 (see FIG. 2). The contact lands $108_1$ (i.e. unshaded) are specific to the first microelectronic device 110 (see FIG. 1). A first connection zone, i.e. Zone 1, may include the contact lands $108_1$ and $108_c$, which may be used to attach the first microelectronic device 110 (see FIG. 1). A second connection zone, i.e. Zone 2, may include the contact lands 108c, which may be used to attach the second microelectronic device 120 (see FIG. 2).

In one embodiment, the second microelectronic device 120 (see FIG. 2) may be viewed as a "base package", which has a smaller body size (i.e. form factor) with a lower input/output count (e.g. the second microelectronic device interconnections 124 of FIG. 2) relative to the first microelectronic device 110 (see FIG. 1), such as a 1-channel memory. The first microelectronic device 110 may be viewed as a "superset package" which has a larger body size with higher input/output count (e.g. the first microelectronic device interconnections 122 of FIG. 1) relative to the second microelectronic device 120, such as a 2-channel memory, or may have other features added in the "superset package". The location and the count of the common contact lands $108_c$ do not change between the "base package" (e.g. the second microelectronic device 120 of FIG. 2) and the "superset package" (e.g. the first microelectronic device 110 of FIG. 1). The contact lands (e.g. contact lands $108_1$) that are specific to the "superset package" (e.g. the first microelectronic device 110 of FIG. 1) may be placed outside the form factor outline of the "base package" (e.g. the second microelectronic device 120 of FIG. 2), e.g. outside the second contact zone, Zone 2, but inside the first contact zone, Zone 1, as shown in FIG. 4.

Therefore, the microelectronic substrate 100 may be designed based on the "superset package" form factor, such that the microelectronic substrate 100 would be capable of using either the "base package" (e.g. the second microelectronic device 120 of FIG. 2) or the "superset package" (e.g. the first microelectronic device 110 of FIG. 1) without any changes to the microelectronic substrate 100. Thus, such a design for the microelectronic substrate 100 assures that the "base package" (e.g. the second microelectronic device 120 of FIG. 2) maps into the "superset package" (e.g. the first microelectronic device 110) and vice versa for common the contact lands $108_c$ of the microelectronic substrate 100, such that each microelectronic device (e.g. the first microelectronic device 110 and the second microelectronic device 120) would function independently at a device level and at a substrate level on the same microelectronic substrate (e.g. the microelectronic substrate 100) to meet their respective requirements, as will be understood to those skilled in the art.

Thus, embodiments of the present description, enables a common microelectronic substrate 100 to be used for two or more different microelectronic devices, as scalable design, which may have different form factors (e.g. body sizes), different features and/or different function.

As the embodiments of the present description would allow a single microelectronic substrate 100 to function for multiple microelectronic devices (such as the first microelectronic device 110 and the second microelectronic device 120), reduction in microelectronic substrate design cost and design time may be realized.

Figure 5:
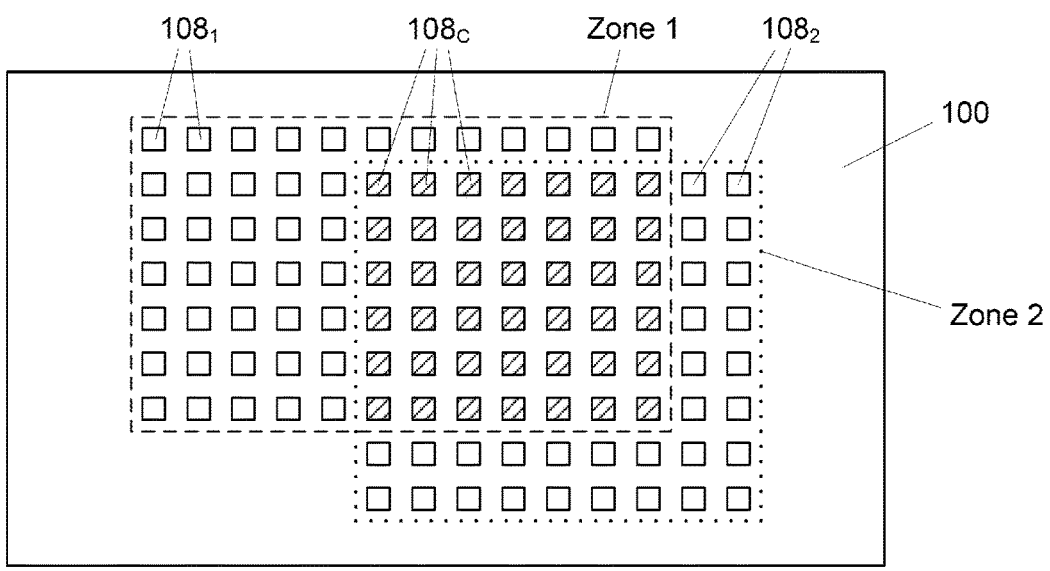
FIG. 5 illustrates a top plane view of another embodiment of a substrate according to the present description.

Although the embodiment of FIG. 4 illustrates the second connection zone, Zone 2, and thereby all of the contact lands for the operation of the second microelectronic device 120 (see FIG. 2), being completely within the first connection zone, Zone 1 (i.e. within the contact lands for the operation of the first microelectronic device 110 (see FIG. 1), the concept of the present description is not so limited. As shown in FIG. 5, the microelectronic substrate 100 may have the first connection zone, Zone 1, and the second connection zone, Zone 2, only partially overlapping. The overlapping portion of the first connection zone, Zone 1, and the second connection zone, Zone 2, would comprise the common contact lands 108c (shaded for clarity). The contact lands (elements $108_1$) that are specific to the first microelectronic device 110 (see FIG. 1) are external to the common contact lands $108_c$ and external to the contact lands $108_2$ specific to the second microelectronic device 120 (see FIG. 2). Likewise, the contact lands (elements $108_2$) that are specific to the second microelectronic device 120 (see FIG. 2) are external to the common contact lands $108_c$ and external to the contact lands $108_1$ specific to the first microelectronic device 110 (see FIG. 1).

Moreover, it is understood that every common contact land $108_c$ need not be used by the first microelectronic device 110 (see FIG. 1) or by the second microelectronic device 120 (see FIG. 2), depending, at least in part, on the functionality of the either the first microelectronic device 110 or the second microelectronic device 120.

It is further understood that although the embodiments of FIGS. 1, 2, 4, and 5 show the microelectronic substrate 100 being configured to alternately accommodate two microelectronic devices (i.e. first microelectronic device 110 of FIG. 1 and second microelectronic device 120 of FIG. 2), the microelectronic substrate 100 could be configured to accommodate any appropriate number of alternate microelectronic devices, which have at least one contact land (e.g. such as contact lands 108c of FIGS. 5 and 6) commonly utilized between them.

Figure 6:
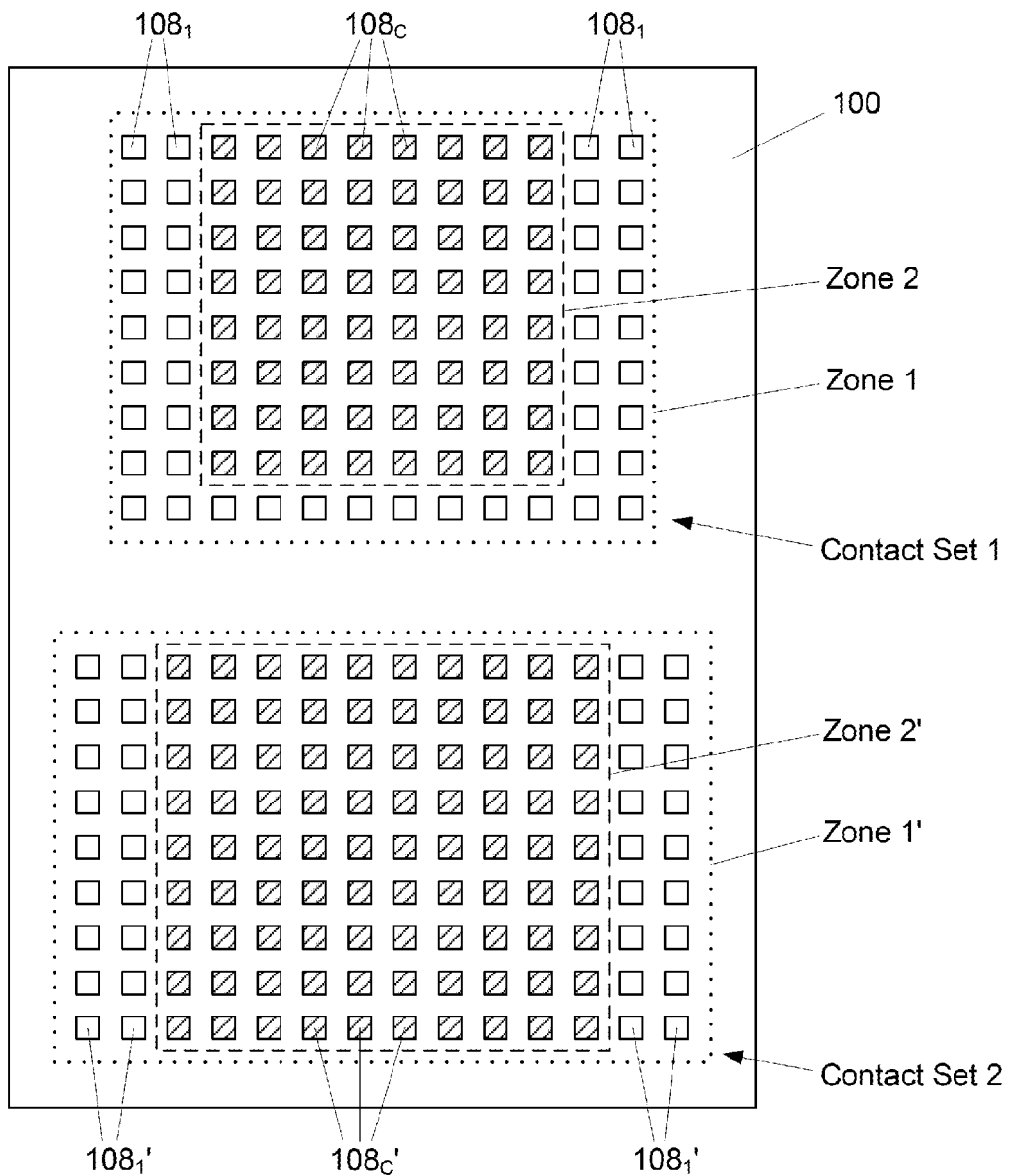
FIG. 6 illustrates a top plane view of still another embodiment of a substrate according to the present description.

Furthermore, it is understood that although the illustrated embodiments of FIGS. 1, 2, 4, and 5 show the microelectronic substrate 100 being configured to alternately accommodate two microelectronic devices (e.g. first microelectronic device 110 and second microelectronic device 120), the concept of the present description is not so limited. It is understood that the microelectronic substrate 100 could be configured to accommodate any appropriate number of contact sets having any appropriate number of alternate microelectronic devices which have at least one common contact land between them. FIG. 6 illustrates one embodiment of the microelectronic substrate 100 having multiple contact sets, illustrated as a first contact set, Contact Set 1, and a second contact set, Contact Set 2. The first contact set, Contact Set 1, may include a plurality of contact lands, shown as elements $108_1$ and $108_c$. The contact lands 108c, which are shaded for clarity, may be common connections with regard to a "superset package" and a "base package", as previously discussed. The contact lands $108_1$ (i.e. unshaded) may be specific to the "superset package". The first connect zone, Zone 1, of the first contact set, Contact Set 1, may include the contact lands $108_1$ and $108_c$, which may be used to attach a "superset package". The second connection zone, Zone 2, of the first contact set, Contact Set 1, may include the contact land 108c, which may be used to attach a "base package". Likewise, the second contact set, Contact Set 2, may include a plurality of contact lands, shown as elements $108_1'$ and $108_c'$. The contact lands $108c'$, which are shaded for clarity, may be are common connections with regard to a "superset package" and a "base package", as previously discussed. The contact lands $108_1'$ (i.e. unshaded) may be specific to the "superset package". The first contact zone, Zone 1', of the second contact set, Contact Set 2, includes the contact lands $108_1'$ and $108_c'$, which may be used to attach the "superset package". The second contact zone, Zone 2', of the second contact set, Contact Set 2, may include the contact lands $108c'$, which may be used to attach the "base package".

Figure 7:
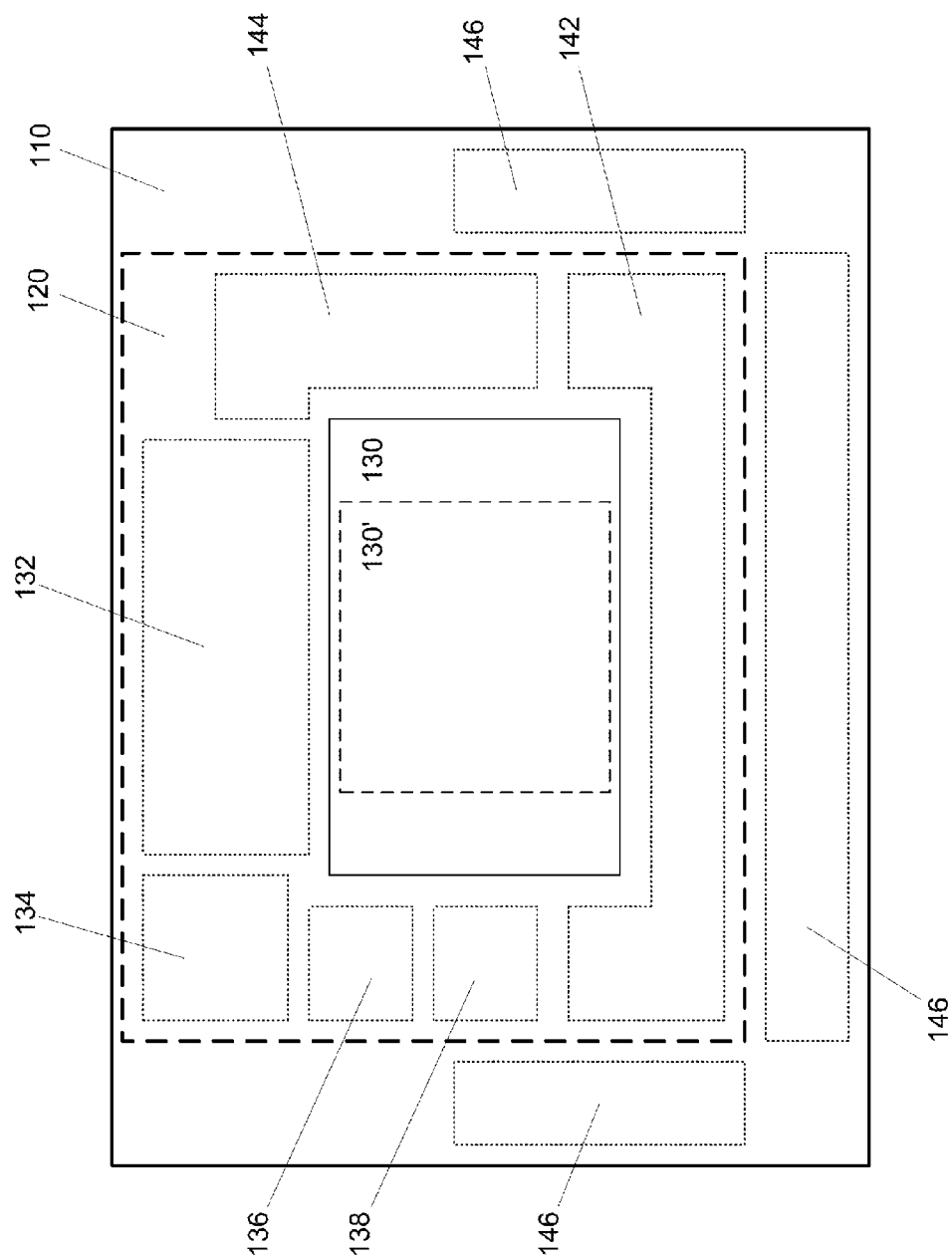
FIG. 7 illustrates a top plane schematic of an embodiment of a first microelectronic device interposed over a second microelectronic device illustrating microelectronic elements common therebetween.

Referring to FIG. 7, the first microelectronic device 110 and the second microelectronic device 120 may have components in substantially identical positions to aid in the trace layer and utilization of the microelectronic substrates 100 of the present description. FIG. 7 illustrates the first microelectronic device 110 interposed over the second microelectronic device 120. As illustrated, a microelectronic die 130, such as a 2-channel memory for a central processing unit or a graphics processing unit, of the first microelectronic device 110 is positioned in a similar location as a microelectronic die 130', such as a 1-channel memory for a central processing unit or a graphics processing units, of the second microelectronic device 120. Common components needed for the functioning of both the first microelectronic device 110 and the second microelectronic device 120 may be positioned in similar locations and may be within the footprint of the smaller of the first microelectronic device 110 and the second microelectronic device 120 (in this illustration within the footprint of the second microelectronic device 120 shown with a dashed line). The common components (illustrated in dotted lines for clarity) may include, but are not limited to, input voltage circuitry 132, peripheral control circuitry 134 (such as PCIE—peripheral component interconnect express), chip-to-chip signal bus circuitry 136, display circuitry 138, memory 142 (such as a dual date rate memory) and miscellaneous operation circuitry 144. Components specific to the first microelectronic device 110 may be outside the footprint of the second microelectronic device 120, but within the footprint of the first microelectronic die 110, such as additional memory 146 (illustrated as three sections), such as additional dual date rate memory.

Figure 8:
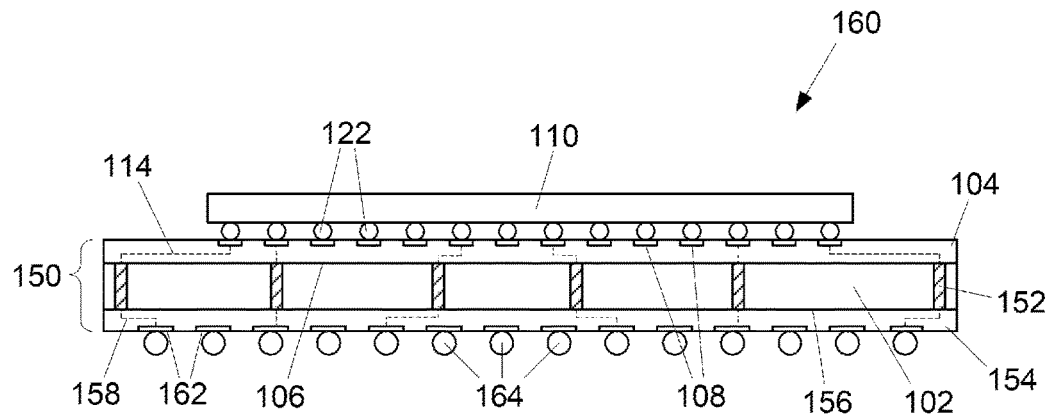
FIG. 8 illustrates a side cross-sectional depiction of a substrate according to one embodiment of the present description, wherein the substrate is illustrated as an interposer having solder-type external interconnects.

FIG. 8 illustrates a microelectronic device package 160, according to one embodiment of the present invention. The microelectronic device package 160 may include the first microelectronic device 110 attached to a microelectronic substrate 150, wherein the microelectronic substrate 150 includes the substrate core 102 having the first trace network 104 formed on the first surface 106 of the substrate core 102, at least one conductive via 152 extending from the substrate core first surface 106 to an opposing second surface 156 of the substrate core 102, such as a plated through-hole via and the like, and a second trace network 154 formed on the substrate core second surface 156 in the manner previously described with regard to the first trace network 104. The conductive via(s) may electrically connect at least one conductive trace 114 within the first trace network to at least one conductive trace 158 within the second trace network 154.

The first microelectronic device 110 may be attached through the plurality of interconnects 122 (shown as solder balls) extending from bond pads (not shown) on the microelectronic device 110 to their respective contact lands 108 in or on the first trace network 104 to make electrical contact therebetween, as will be understood by those skilled in the art. The second trace network 154 may include a plurality of external contact lands 162 formed therein or thereon. A plurality of external solder interconnects 164 (shown as solder balls, e.g. a ball grid array) may be formed on the plurality of external contact lands 162. The external solder interconnects 164 may be used to connect the microelectronic device package 160 to an external component (not shown) by a control collapse chip connection, as will be understood to those skilled in the art. Thus, the microelectronic substrate 150 may act as an interposer to route signals between the microelectronic device 110 and the external component (not shown).

Figure 9:
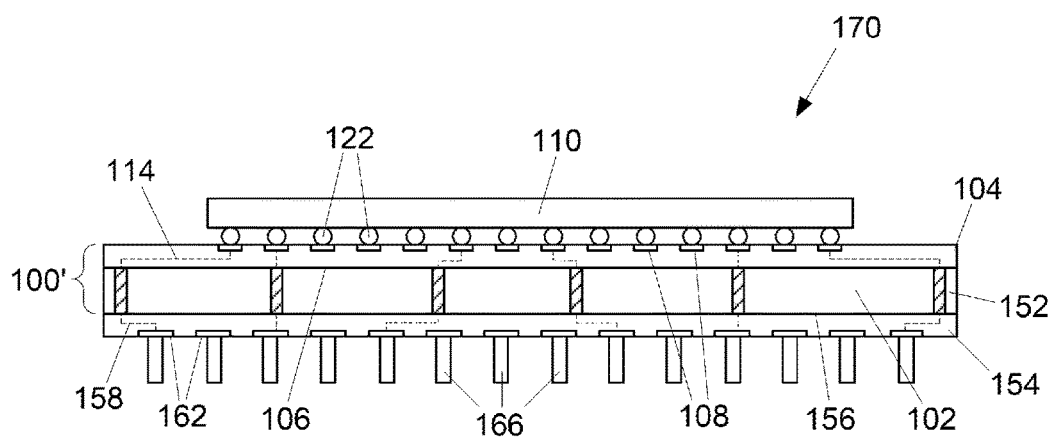
FIG. 9 illustrates a side cross-sectional depiction of a substrate according to one embodiment of the present description, wherein the substrate is illustrated as an interposer having pin-type external interconnects.

FIG. 9 illustrates an alternative microelectronic device package 170, according to an embodiment of the present invention. The microelectronic device package 170 may have some of the same or similar components as the embodiment illustrated in FIG. 8. A plurality of pin interconnects 166 may be attached to the plurality of external contact lands 162 (rather than the external solder interconnects 164 of FIG. 8) to form a pin grid array device. Thus, the microelectronic device package 170 may be attached to a socket (not shown) mounted on an external component (not shown), as will be understood to those skilled in the art.

Although the microelectronic substrates of the present description are described in reference to a few microelectronic applications, it is understood that the concepts may be applied to a variety of applications, including but not limited, to test fixtures, mobile devices, desktop and server systems with central processing units and/or graphics processing units, high-definition multimedia interface motherboards, and the like. Furthermore, although the microelectronic substrates of the present description are described with examples specifically in the field of microelectronic packaging, it will be understood by those skilled in the art that the concepts disclosed in the present description may be applied to a variety of electronic and microelectronic applications.

Figure 10:
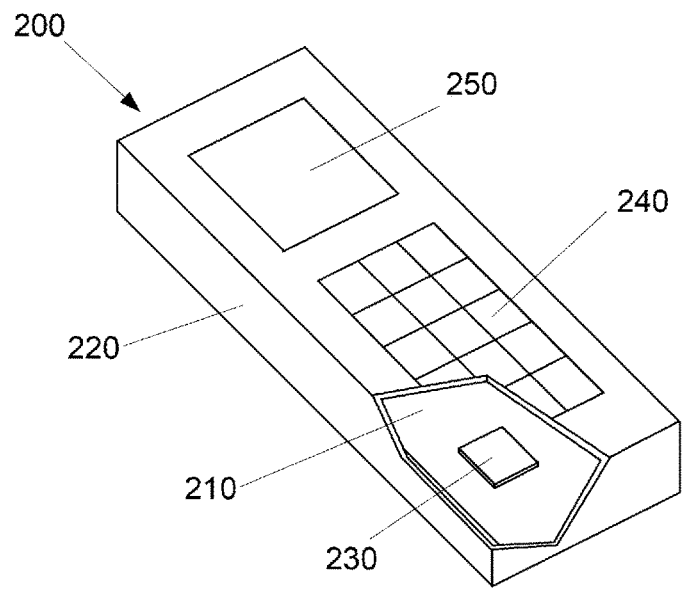
FIG. 10 illustrates an embodiment of a portable electronic device, according to embodiments of the present description.

FIG. 10 illustrates an embodiment of a portable system/device 200, such as a portable computer, a mobile telephone, a digital camera, a digital music player, a web tablet/pad device, a personal digital assistant, a pager, an instant messaging device, or other devices. The portable system/device 200 may be adapted to transmit and/or receive information wirelessly, such as through a wireless local area network (WLAN) system, a wireless personal area network (WPAN) system, and/or a cellular network. The portable system/device 200 may comprise a substrate 210 within a housing 220. The substrate 210 may have various microelectronic devices 230 electrically coupled thereto including, but not limited to, a microelectronic device package, a microprocessor (such as a central processing units (CPUs), chipsets, graphics processing units, ASICs, or other command/data processing device), a memory device, and the like. The substrate 210 may be attached to various peripheral devices including an input device 240, such as keypad, and a display device 250, such an LCD display. It is understood that the display device 250 may also function as the input device, if the display device 250 is touch sensitive. The embodiments of the present description may be incorporated into any of the components of the portable system/device 200, including but not limited to the substrate 210 and/or the microelectronic component(s) 220.

Figure 11:
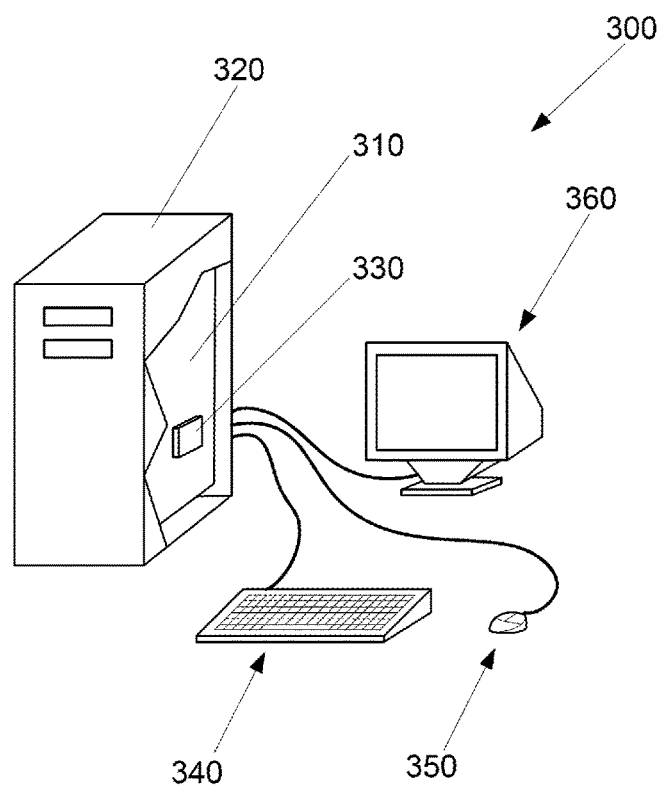
FIG. 11 illustrates an embodiment of a computer system, according to embodiments of the present description.

FIG. 11 illustrates an embodiment of a computer system 300, such as a desktop computer, a server, and the like. The computer system 300 may comprise a substrate or motherboard 310 within a housing 320. The motherboard 310 may have various microelectronic devices 330 electrically coupled thereto including, but not limited to a microprocessor (such as a central processing units (CPUs), chipsets, graphics processor, ASICs, or other command/data processing device), a memory device (such as DRAM, flash memory, a BIOS chip, a solid state drive, and the like), and any other appropriate electrical component. The substrate or motherboard 310 may be attached to various peripheral devices including inputs devices, such as a keyboard 340 and/or a mouse 350, and a display device, such as a monitor 360. The embodiments of the present description may be incorporated into any of the components of the computer system 300, including but not limited to the motherboard 310 and/or the microelectronic device(s) 330.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic apparatus, comprising:
a substrate having a first surface;
a plurality of contact lands formed on the substrate first surface, the plurality of contact lands positioned to selectively couple with either a first microelectronic device or a second microelectronic device, wherein the first surface includes a first contact zone having a first portion of the contact lands positioned therein and a second contact zone having a second portion of the contact lands positioned therein, wherein the first contact zone overlaps at least some of the second contact zone such that a third portion of the contact lands is common between the first portion of the contact lands and the second portion of the contact lands and a fourth portion of the contact lands in the first portion of the contact lands is not common with the second portion of the contact lands, wherein the first portion of the contact lands within the first contact zone, including the third and fourth portions of the contact lands, are positioned to attach to the first microelectronic device, the first microelectronic device to attach exclusively to the contacts lands within the first contact zone, wherein the second portion of the contact lands within the second contact zone, including the third portion of the contact lands, are positioned to attach to the second microelectronic device, the second microelectronic device to attach exclusively to the contacts lands within the second contact zone, the first microelectronic device being different than the second microelectronic device; and
a plurality of conductive traces formed in the substrate, a first portion of the conductive traces electrically connected with the third portion of the contact lands to enable implementation of a first functionality common to both the first and second microelectronic devices when either the first microelectronic device or the second microelectronic device is operatively coupled to the contact lands in the respective first or second contact zones, a second portion of the conductive traces electrically connected with the fourth portion of the contact lands to enable implementation of a second functionality of the first microelectronic device when the first microelectronic device is operatively coupled to the contact lands in the first contact zone, wherein the second microelectronic device does not include the second functionality.

2. The microelectronic apparatus of claim 1, wherein the substrate includes:
   a substrate core; and
   a first trace network formed on a first surface of the substrate core, the first trace network defining the plurality of conductive traces, wherein the contact lands are formed in or on the first trace network.

3. A microelectronic system, comprising:
   a motherboard;
   a substrate having a first surface and a second surface, wherein the second surface is attached to the motherboard;
   a plurality of contact lands formed on the substrate first surface, wherein the plurality of contact lands are defined by a first contact zone having a first portion of the plurality of contact lands located therein and a second contact zone having a second portion of the plurality of contact lands located therein, wherein the first contact zone overlaps at least some of the second contact zone such that a third portion of the plurality of contact lands is common between the first portion of the plurality of contact lands and the second portion of the plurality of contact lands and a fourth portion of the plurality of contact lands within the first portion of the plurality of contact lands is not common with the second portion of the plurality of contact lands;
   a single microelectronic device selectively corresponding to either (a) a first microelectronic device or (b) a second microelectronic device different than the first microelectronic device, the single microelectronic device to be attached to the third and fourth portions of the plurality of contact lands within the first portion of the plurality of contact lands when the single microelectronic device corresponds to the first microelectronic device, the single microelectronic device to be attached to the third portion of the plurality of contact lands within the second portion of the plurality of contact lands and not the fourth portion of the plurality of contact lands within the first portion of the plurality of contact lands when the single microelectronic device corresponds to the second microelectronic device; and
   a plurality of conductive traces formed in the substrate, a first portion of the conductive traces electrically connected with the third portion of the contact lands to enable implementation of a first functionality common to both the first and second microelectronic devices when either the first microelectronic device or the second microelectronic device is operatively coupled to the plurality of contact lands in the respective first or second contact zones, a second portion of the conductive traces electrically connected with the fourth portion of the contact lands to enable implementation of a second functionality of the first microelectronic device when the first microelectronic device is operatively coupled to the plurality of contact lands in the first contact zone, wherein the second microelectronic device does not include the second functionality.

4. The microelectronic system of claim 3, wherein the substrate includes:
   a substrate core; and
   a first trace network formed on a first surface of the substrate core, the first trace network defining the plurality of conductive traces, wherein the plurality of contact lands are formed in or on the first trace network.

5. A microelectronic apparatus, comprising:
   a substrate having a first surface;
   a plurality of contact lands formed on the substrate first surface, the plurality of contact lands including first contact lands, second contact lands, and third contact lands, wherein the first and second contact lands are positioned to attach to a first microelectronic device without the third contact lands being electrically coupled to the first microelectronic device, wherein the first and third contact lands are positioned to attach to a second microelectronic device, the first microelectronic device prevented from attaching to the first contact lands when the second microelectronic device is attached to the first and third contact lands, the second microelectronic device prevented from attaching to the first and third contact lands when the first microelectronic device is attached to the first and second contact lands; and
   a plurality of conductive traces formed in the substrate, a first portion of the conductive traces electrically connected with the first contact lands to enable implementation of a first functionality common to both the first and second microelectronic devices when either (1) the first microelectronic device is operatively coupled to the first and second contact lands or (2) the second microelectronic device is operatively coupled to the first and third contact lands, a second portion of the conductive traces electrically connected with the third contact lands to enable implementation of a second functionality of the second microelectronic device when the second microelectronic device is operatively coupled to the first and third contact lands, wherein the first microelectronic device does not include the second functionality.

6. The microelectronic apparatus of claim 5, wherein the second contact lands are not electrically coupled to the second microelectronic device when the second microelectronic device is coupled to the substrate.

7. The microelectronic apparatus of claim 5, wherein the substrate includes:
   a substrate core; and
   a first trace network formed on a first surface of the substrate core, the first trace network defining the plurality of conductive traces, wherein the plurality of contact lands are formed in or on the first trace network.

* * * * *